(12) United States Patent
Fernandez-Corbaton et al.

(10) Patent No.: US 7,616,935 B2
(45) Date of Patent: *Nov. 10, 2009

(54) METHOD AND APPARATUS FOR MATCHING RECEIVER CARRIER FREQUENCY

(75) Inventors: Ivan Jesus Fernandez-Corbaton, San Diego, CA (US); John Smee, San Diego, CA (US); Srikant Jayaraman, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/509,388

(22) Filed: Aug. 23, 2006

(65) Prior Publication Data

US 2006/0286954 A1 Dec. 21, 2006

Related U.S. Application Data

(63) Continuation of application No. 10/112,469, filed on Mar. 29, 2002, now Pat. No. 7,099,642.

(60) Provisional application No. 60/337,469, filed on Nov. 9, 2001.

(51) Int. Cl.
*H04B 1/06* (2006.01)
*H04L 27/00* (2006.01)

(52) U.S. Cl. .................. 455/255; 455/258; 455/265; 455/192.1; 455/192.3; 375/326; 375/344; 375/375

(58) Field of Classification Search .......... 455/255, 455/258, 265, 192.1, 192.3; 375/326, 344, 375/375

See application file for complete search history.

(56) References Cited

U.S. PATENT DOCUMENTS 4,947,409 A * 8/1990 Raith et al. ............. 375/344

(Continued)

FOREIGN PATENT DOCUMENTS

EP 0689324 12/1995

(Continued)

OTHER PUBLICATIONS

International Search Report PCT/US2002/035877, International Search Authority European Patent Office Mar. 5, 2003.

(Continued)

*Primary Examiner*—Duc M Nguyen
(74) *Attorney, Agent, or Firm*—Kenneth K. Vu; Jeffrey D. Jacobs

(57) ABSTRACT

A carrier recovery method and apparatus using multiple stages of carrier frequency recovery are disclosed. A receiver uses multiple frequency generation sources to generate carrier signals used to downconvert a received signal. An analog frequency reference having a wide frequency range and coarse frequency resolution is used in conjunction with a digital frequency reference having a narrow frequency range and fine frequency resolution. The multiple carrier signals are multiplied by a received signal to effect a multi-stage downconversion, resulting in a baseband signal. A frequency tracking module measures the residual frequency error present in the baseband signal. The measured residual frequency error is then used to adjust the frequencies of the carrier signals generated by the multiple frequency generation sources.

26 Claims, 3 Drawing Sheets

U.S. PATENT DOCUMENTS

| | | | | |
|---|---|---|---|---|
| 5,440,587 A | * | 8/1995 | Ishikawa et al. | 375/332 |
| 5,487,186 A | * | 1/1996 | Scarpa | 455/192.2 |
| 5,533,050 A | * | 7/1996 | Isard et al. | 375/229 |
| 5,712,869 A | * | 1/1998 | Lee et al. | 375/141 |
| 5,832,043 A | * | 11/1998 | Eory | 375/344 |
| 5,995,563 A | * | 11/1999 | Ben-Efraim et al. | 375/344 |
| 6,023,491 A | * | 2/2000 | Saka et al. | 375/326 |
| 6,154,640 A | * | 11/2000 | Itoh et al. | 455/76 |
| 6,192,088 B1 | * | 2/2001 | Aman et al. | 375/326 |
| 6,310,924 B1 | * | 10/2001 | Kang et al. | 375/326 |
| 6,317,067 B1 | * | 11/2001 | Mohindra | 341/145 |
| 6,351,506 B1 | * | 2/2002 | Lewicki | 375/350 |
| 6,363,126 B1 | * | 3/2002 | Furukawa et al. | 375/344 |
| 7,099,642 B2 | * | 8/2006 | Fernandez-Corbaton et al. | 455/255 |
| 2003/0026362 A1 | * | 2/2003 | Kimura | 375/344 |
| 2003/0027537 A1 | * | 2/2003 | Kimura | 455/232.1 |

FOREIGN PATENT DOCUMENTS

| | | |
|---|---|---|
| EP | 1454111 | 10/2004 |
| JP | 01054944 | 2/1989 |
| JP | 08-335959 | 12/1996 |
| JP | 11-284514 | 10/1999 |
| JP | 2000-59242 | 2/2000 |

OTHER PUBLICATIONS

International Preliminary Examination Report PCT/US2002/035877, IPEA/US, May 9, 2004.

* cited by examiner

METHOD AND APPARATUS FOR MATCHING RECEIVER CARRIER FREQUENCY

CLAIM OF PRIORITY UNDER 35 U.S.C. §120

The present Application for Patent is a Continuation and claims priority to patent application Ser. No. 10/112,469 entitled "METHOD AND APPARATUS FOR MATCHING RECEIVER CARRIER FREQUENCY" filed Mar. 29, 2002 now U.S. Pat. No. 7,099,642, now allowed, and assigned to the assignee hereof and hereby expressly incorporated by reference herein.

This application claims priority from U.S. Provisional Application No. 60/337,469, filed Nov. 9, 2001, entitled "Method and Apparatus for Matching Receiver Carrier Frequency."

BACKGROUND

1. Field

The disclosed embodiments relate generally to wireless communications, and more specifically to matching the frequency of a received carrier signal in a mobile wireless communication system.

2. Background

As modern-day wireless communication systems become more prevalent, the demand for wireless system capacity increases. In order to support a greater number of subscribers, a wireless service provider can either increase the frequency spectrum used for its systems or find ways to support more subscribers within its already-allocated frequency spectrum. Often unable to acquire additional frequency spectrum, wireless service providers must often look instead for ways to increase capacity without using more spectrum. In other words, wireless service providers must find more efficient ways to use their existing spectrum.

In response to the demand for more efficient use of spectrum, manufacturers of wireless equipment have developed various techniques for increasing the capacity of wireless systems. One way of providing efficient wireless voice and data communications is the use of code division multiple access (CDMA) techniques. Several standards using CDMA techniques have been developed for terrestrial wireless voice and data systems. Examples of such standards include the "TIA/ELA/IS-95 Mobile Station-Base Station Compatibility Standard for Dual-Mode Wideband Spread Spectrum Cellular System", hereinafter referred to as "IS-95," and "TIA/EIA/IS-2000," hereinafter referred to as "cdma2000." Additional standards have been proposed for wireless communication systems that are optimized to provide high-speed wireless data communications. Examples of such standards for high-speed wireless data communications include "TIA/EIA/IS-856," hereinafter referred to as "HDR."

In an HDR system, the rate at which a user terminal can receive data may be limited by the quality of signals that the user terminal receives. In such a system the data rate of signals transmitted to a user terminal is determined based on measurements of received signal quality made at the user terminal. One type of quality measurement used to determine data rate is the carrier-to-interference (C/I) ratio of the received signal. When the power of the received carrier signal is strong compared to the power of interfering signals, then the C/I value is said to be high. When the power of the received carrier signal is weak compared to the interference, then the C/I is said to be low. When the C/I value is high, the user terminal can receive more data within a given period of time. When the C/I value is low, the rate of data sent to the user terminal is reduced in order to maintain an acceptable frame error rate.

Carrier frequency recovery is one aspect of user terminal design that can greatly affect the C/I perceived by the user terminal. Carrier frequency recovery refers to the generation within a user terminal of a reference carrier signal having the same frequency as a carrier signal received from a base station. The user terminal uses the reference carrier signal to demodulate data signals received from a base station. A mismatch between the reference carrier signal and the received carrier signal, called carrier frequency mismatch, decreases the efficiency of the demodulation process. Such decreased efficiency of demodulation is perceived at the user terminal as a decrease in C/I. Carrier frequency mismatch thus decreases the rate at which data can be sent to the user terminal.

In tension with the need for precise carrier frequency recovery is the desire to minimize the hardware cost of the user terminal. The market for user terminal equipment such as wireless phones and modems is very competitive and is often characterized by low profit margins, or even subsidies by service providers. There is therefore a need in the art for techniques that increase the precision of carrier frequency recovery in user terminal equipment without substantially increasing the cost of user terminal hardware.

SUMMARY

Embodiments disclosed herein address the above stated needs by dividing the task of carrier frequency recovery into multiple stages of differing resolution. In an exemplary aspect, the user terminal tracks the frequency of signals received from a base station. The base station often uses a very accurate frequency source such as a GPS receiver, thus permitting the use of simpler and cheaper frequency sources in the user terminal. An exemplary user terminal includes a means for generating an error signal indicative of the difference between the frequency of a received carrier and that of a locally generated reference carrier. The error signal is used to adjust the frequency of the reference carrier until it matches the frequency of the received carrier.

In an exemplary aspect, a reference carrier is generated using two stages, with a first stage generating a carrier having a broad frequency range but coarse frequency resolution, and a second stage having a more narrow range but finer frequency resolution. In such an aspect, the first stage is an analog device such as a voltage-controlled oscillator, and the second stage is a digital device such as a digital oscillator. The frequency of the signal generated by the first stage may be adjusted such that the frequency of the signal generated by the second stage can be kept within a predetermined frequency range.

The word "exemplary" is used herein to mean "serving as an example, instance, or illustration." Any embodiment described as an "exemplary embodiment" is not necessarily to be construed as being preferred or advantageous over other embodiments.

DETAILED DESCRIPTION

A user terminal referred to herein may be mobile or stationary, and may communicate with one or more base stations. A user terminal transmits and receives data packets through one or more base stations. The base stations are called modem pool transceivers. Each modem pool transceiver may be connected to an HDR base station controller called a modem pool controller (MPC). Modem pool transceivers and modem pool controllers are parts of a network called an access network. The interconnected nodes of the access network typically communicate with each other using fixed, land-based connections such as T1 connections. An access network transports data packets between multiple user terminals. The access network may be further connected to additional networks outside the access network, such as a corporate intranet or the Internet, and may transport data packets between each user terminal and such outside networks. A user terminal that has established an active traffic channel connection with one or more modem pool transceivers is called an active user terminal, and is said to be in a traffic state. A user terminal that is in the process of establishing an active traffic channel connection with one or more modem pool transceivers is said to be in a connection setup state. A user terminal may be any data device that communicates through a wireless channel or through a wired channel, for example using fiber optic or coaxial cables. A user terminal may further be any of a number of types of devices including but not limited to PC card, compact flash, external or internal modem, or wireless or wireline phone. The communication link through which the user terminal sends signals to the modem pool transceiver is called a reverse link. The communication link through which a modem pool transceiver sends signals to a user terminal is called a forward link.

Figure 1:
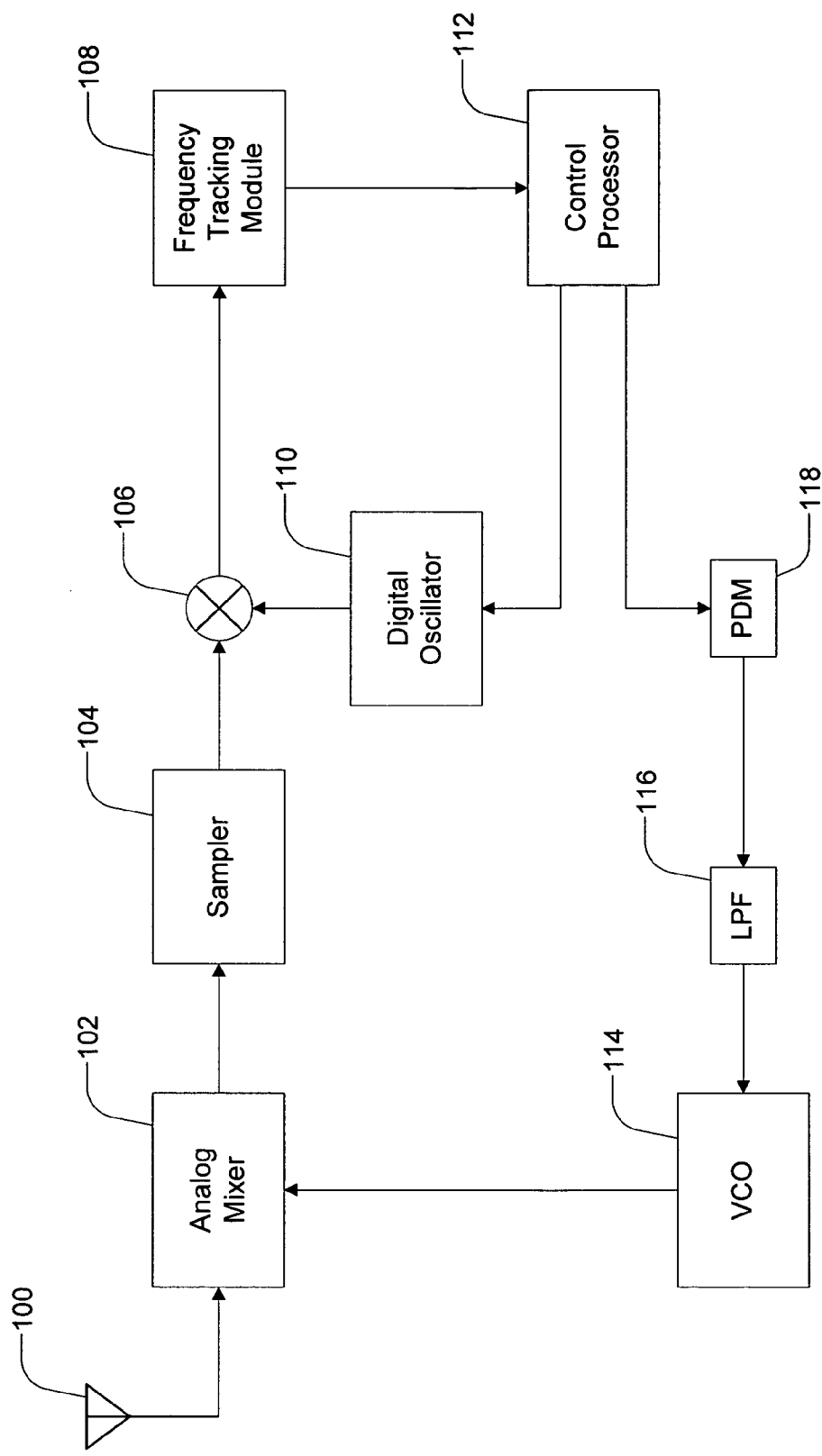
FIG. 1 shows a multiple-stage carrier frequency recovery apparatus.

FIG. 1 is a block diagram of an embodiment of an exemplary multiple-stage carrier frequency recovery apparatus. In the embodiment shown, carrier frequency recovery is divided into two stages, one using an analog carrier signal source 114 and another using a digital carrier signal source 110. An embodiment may have more than two stages, or use different combinations of analog and digital stages.

A signal is received through an antenna 100 and mixed with an analog carrier signal in an analog mixer 102. The analog carrier signal is generated by a variable-frequency signal source such as a voltage-controlled oscillator (VCO) 114. The frequency of the carrier signal generated by the VCO 114 varies based on an input voltage. The input voltage is based on a digital control signal provided by a control processor 112. In the exemplary embodiment shown, the digital control signal is converted into an input voltage to the VCO 114 using a pulse density modulator (PDM) 118 and a low-pass filter (LPF) 116. The PDM 118 receives a digital value from the control processor 112 and outputs a train of pulses having a duty-cycle that is based on the digital value. The LPF 116 may be a simple RC circuit or an integrator or any equivalent circuit. The LPF 116 converts the pulse train output by the PDM 118 into a DC voltage that determines the frequency of the carrier signal output from the VCO 114. In an alternate embodiment, the PDM 118 and LPF 116 are replaced with a simple digital-to-analog converter (DAC).

The resolution of the voltage adjustments that can be made at the input to the VCO 114 is relatively coarse. In other words, a change of the least-significant bit in the digital value provided from the control processor 112 to the PDM 118 may result in a relatively large change in the frequency of the carrier signal output by the VCO 114. Thus, the control processor 112 cannot generally cause the frequency of the carrier signal output by the VCO 114 to match the carrier frequency of signal received through the antenna 100. Even if a high-resolution DAC is substituted for the LPF 116 and PDM 118, analog noise at the input to the VCO 114 makes fine-tuning of the VCO output frequency very inexact.

Because of the expected mismatch in frequency between the output of the VCO 114 and the carrier frequency of the signal received through the antenna 100, the output of the analog mixer 102 is generally not a pure baseband signal. In other words, the signal output by the analog mixer 102 will generally retain a low-frequency carrier component.

In the exemplary embodiment shown, the remaining low-frequency carrier is separated from the desired baseband signal in the digital domain. The output of the analog mixer 102 is therefore digitally sampled in a sampler 104 and mixed with a low-frequency digital carrier in a digital mixer 106. The output of the digital mixer 106 is the downconverted baseband signal that is provided to decoding circuitry known in the art such as filters, PN and/or Walsh despreaders, deinterleavers, and decoders. The low-frequency digital carrier is generated by a digital oscillator 110. The frequency of the carrier generated by the digital oscillator 110 can be adjusted with greater resolution than the carrier generated by VCO 114, although the VCO 114 can be adjusted over a wider range of frequencies. For example, VCO 114 may be capable of producing signals within a frequency range of ±45 megahertz in steps of 30 hertz, where digital oscillator 110 can produce signals with an arbitrarily fine resolution and a frequency range only limited by the analog to digital converter sampling frequency. One skilled in the art will recognize that obvious variations using different combinations of digital and analog frequency generators and mixers are alternate embodiments of the embodiment described above.

In an exemplary embodiment, digital oscillator 110 is a digital rotator capable of generating fine-resolution frequency and phase correction signals. By increasing the number of bits used to represent the frequency and phase inputs, a digital rotator can be readily designed to have greater frequency and phase resolution. In an alternative embodiment, digital oscillator 110 is a direct digital synthesizer (DDS). Digital oscillator 110 may also be any of a variety of other types of digital frequency reference generator. VCO 114 could be any of a variety of voltage-controlled oscillators, including a temperature-controlled crystal oscillator (TCXO) or oven-controlled crystal oscillator (OCXO).

A frequency tracking module 108 measures the residual frequency error in the signal output by digital mixer 106 and generates at least one error signal that is provided to a control processor 112. The control processor 112 uses the at least one error signal from the frequency tracking module 108 to adjust control signals to the digital oscillator 110 and the PDM 118. By changing the control signal provided to the PDM 118, the control processor 112 effects a change in the frequency of the signal output by the VCO 114.

In an exemplary embodiment, the control processor 112 controls the output frequency of the VCO 114 such that the remaining frequency correction needed is within a predetermined optimal or operational range of the digital oscillator 110. For example, even where the digital oscillator 110 is capable of generating frequencies within a frequency band having a width of several megahertz, the VCO 114 is adjusted such that the frequency of the digital oscillator 110 may be maintained within a range having a width of 128 hertz. Additionally, it may be desirable to keep the VCO frequency reference relatively close to the carrier frequency of the received signal. Adjusting the frequency of the VCO 114 to be as close as possible to the received carrier frequency will tend to minimize the frequency of the signal output by the digital oscillator 110.

Also, in order to keep the digital oscillator 110 operating within its optimal or operational frequency range, the control processor 112 increases the VCO 114 frequency and decreases the digital oscillator 110 frequency. Conversely, where appropriate, the control processor 112 decreases the VCO 114 frequency and increases the digital oscillator 110 frequency.

In an exemplary embodiment, the control processor 112 adjusts the coarse frequency in fixed frequency steps by changing a digital control signal provided to the PDM 118. For example, if the PDM has a resolution of 30 Hz per bit, the control processor 112 may increase the PDM control signal by 30, 60, or 90 Hz by changing the digital input value of the PDM by 1, 2, or 3. At the same time, the control processor 112 adjusts the control signal to the digital oscillator 110 such that the output frequency of the digital oscillator 110 is decreased by 30, 60, or 90 Hz. Due to the coarse resolution of the output of the VCO 114, the size of the frequency step for the VCO 114 can only be estimated. In contrast, the size of the frequency step of the digital oscillator 110 is very precise. Consequently, even after the digital oscillator 110 frequency is adjusted to compensate for a step change in VCO 114 frequency, the digital oscillator 110 must generally be further adjusted before the output of the digital mixer 106 will have a frequency and phase that best matches that of the received carrier signal.

Figure 2:
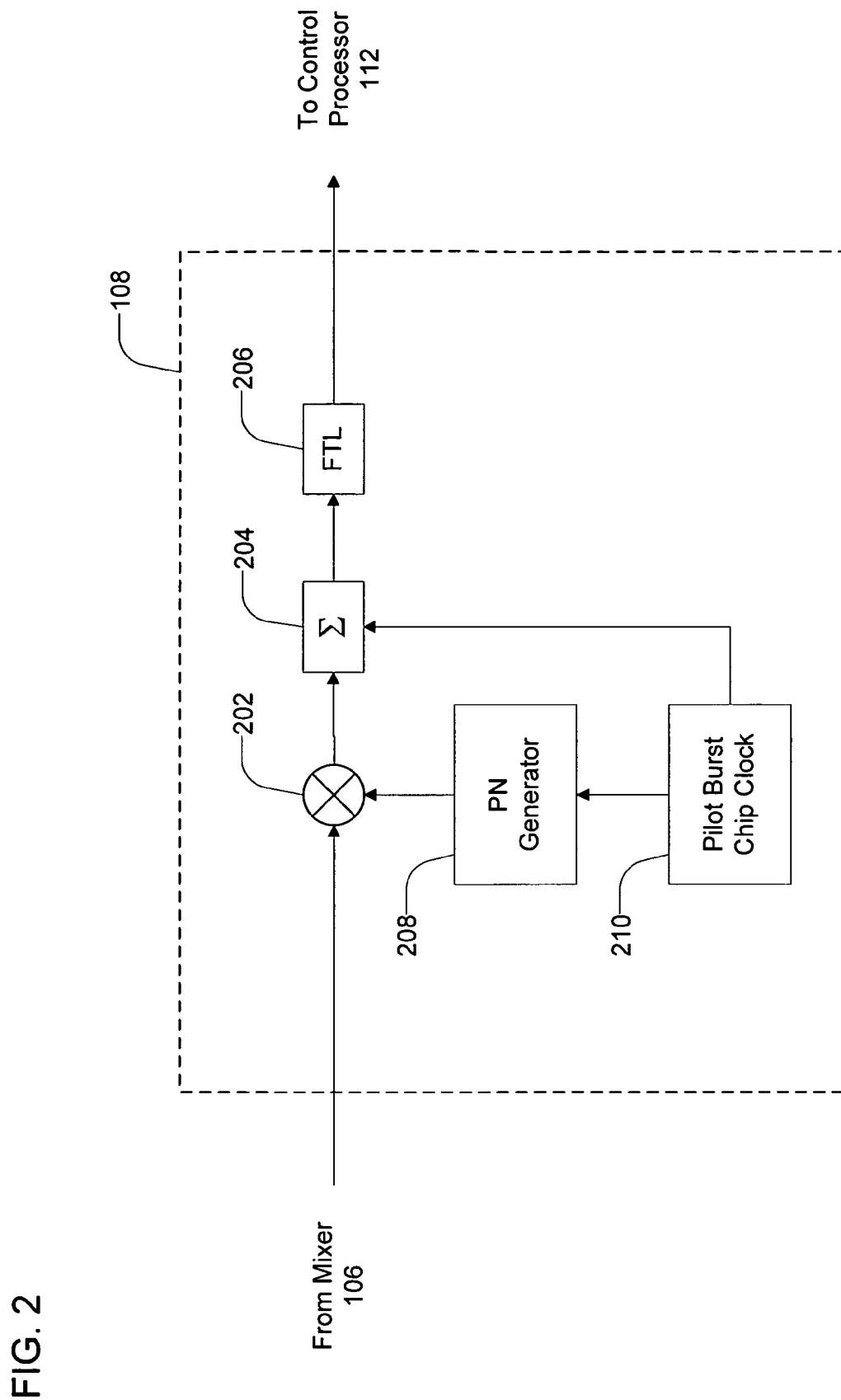
FIG. 2 shows a frequency tracking module apparatus.

FIG. 2 is a more detailed diagram of an embodiment of a frequency tracking module 108 that is suitable for use in an HDR system. In an exemplary embodiment, the receiver uses exclusively signals received within two pilot bursts received within every slot. In HDR, for example, each slot is 1.667 milliseconds long, with one pilot burst centered within each half of the slot. In other words, each slot has a first pilot burst centered 417 microseconds from the start of the slot and a second pilot burst centered 1.25 milliseconds from the start of the frame. In HDR, each pilot burst has a duration of 96 chips at a chip rate of 1.2288 megahertz. Before transmission, the pilot burst signals are multiplied by a pseudonoise (PN) sequence. The frequency tracking module 108 shown in FIG. 2 serves to remove the PN component of the downconverted baseband signal received from the digital mixer 106 and accumulates the portion of the signal received within the pilot bursts.

A pilot burst chip clock 210 generates clock signals during the pilot bursts of each received slot. The clock signals are provided to a PN generator 208 that then generates a PN signal having the same clock rate as the pilot burst chip clock 210. That PN signal is then mixed with the downconverted baseband signal in a digital mixer 202, to produce a PN despread pilot signal. The PN despread pilot signal is then accumulated over the pilot burst period in an accumulator 204. The output of the accumulator 204 will be a phase error signal corresponding to the phase error of the now fully demodulated pilot signal. This phase error signal is then provided to a frequency tracking loop (FTL) 108, which converts the phase error signal into a digital signal that can be used by the control processor 112. One of skill in the art would recognize that FTL 108 could be a first-order loop, a second-order loop, or other configuration of FTL.

In an exemplary embodiment, the frequency tracking module 108 generates one phase error estimate per slot using the two pilot burst periods within the slot. In an alternate embodiment, the frequency tracking module 108 generates more than one phase error estimate per slot. For example, the frequency tracking module 108 may generate one phase error estimate for each half-pilot-burst period, resulting in four phase error estimates. These phase error estimates can then be used to estimate a rate of phase change, and thus the remaining frequency error remaining in the baseband signal. Because of the smaller sampling period used to generate each phase error estimate, phase error measurements based on half of a pilot burst are more noisy than a single estimate generated over two pilot burst periods. In another alternate embodiment, one phase error estimate is generated for each pilot burst period in a slot, resulting in two phase error estimates. In another alternate embodiment, a single phase error estimate is generated using the pilot burst periods over more than one slot. Because of aliasing concerns, the selection of number of phase error estimates over a number of slots represents a tradeoff of signal noise to the size of frequency error that can be detected. In an alternate embodiment, the frequency tracking module 108 can be configured by the control processor 112 in real time to operate in any of several modes, wherein each mode uses a different ratio of phase error estimates to slots.

In HDR, the pilot is spread using the all-one's code, so there is no need for an explicit Walsh despreader between the digital mixer 202 and the integrator 204. In an exemplary embodiment, the PN generator 208 generates a complex PN code, and the digital mixer 202 is a complex multiplier. The complex output of the digital mixer 202 is accumulated in the accumulator 204 in such a way that phase information is preserved in real and imaginary portions of the accumulated value.

Figure 3:
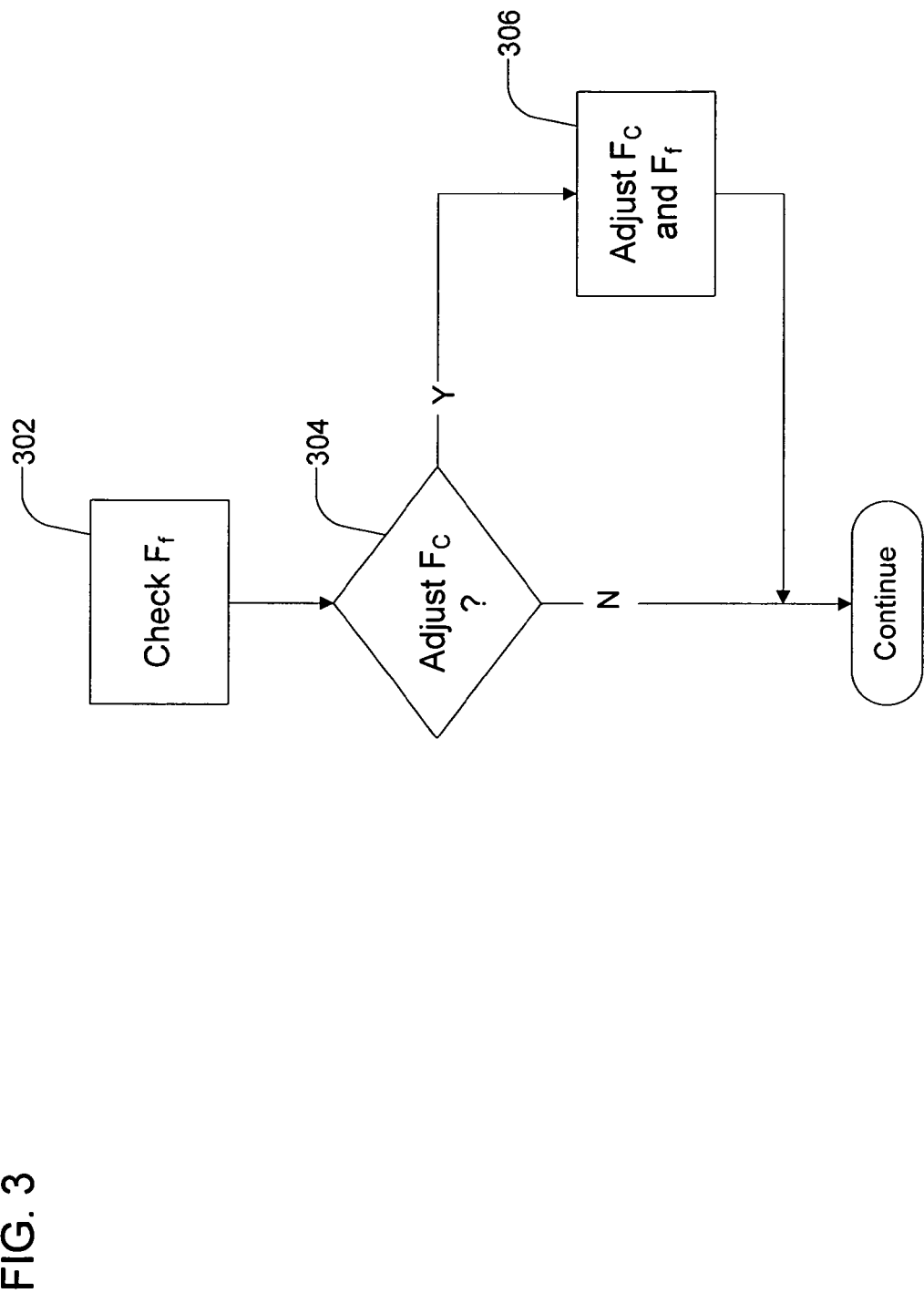
FIG. 3 is a flowchart showing a method for adjusting down-converter frequencies in a multiple-stage carrier frequency recovery system.

FIG. 3 is a flowchart of an exemplary method for adjusting downconverter frequencies in a multiple-stage carrier frequency recovery system, such as shown in FIG. 1. During the operation of the carrier frequency recovery system, the fine frequency value $F_f$ is monitored at step 302 to determine when it is operating within the optimal or operational frequency range of a fine frequency generation source, such as the digital oscillator 110 shown in FIG. 1. At step 304, the fine frequency value $F_f$ is tested to determine whether an adjustment should be made in the coarse frequency output of a coarse frequency generation source, such as the VCO 114 shown in FIG. 2. If an adjustment is necessary, then both $F_f$ and $F_C$ are adjusted at step 306. If no adjustment is necessary, then the adjustment step of 306 is skipped. Within step 306, if $F_f$ is increased, then $F_C$ is decreased by approximately the same amount. If $F_f$ is decreased, then $F_C$ is increased by approximately the same amount.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The various illustrative logical blocks, modules, and circuits described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor, such as the control processor 112 described above, may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A method for downconverting a received signal, the method comprising:
   generating an analog carrier signal using a pulse density modulator and a low-pass filter, said analog carrier signal having a first frequency from a first generation source having a first frequency range and a first frequency resolution;
   generating a digital carrier signal having a second frequency from a second generation source having a second frequency range and a second frequency resolution, wherein said first frequency range is greater than said second frequency range, and said first frequency resolution is less than said second frequency resolution;
   multiplying the received signal by the analog carrier signal and the digital carrier signal to generate a downconverted signal;
   determining phase error estimates in the downconverted signal;
   estimating a rate of phase change based on a plurality of phase error estimates; and
   controlling the first and second generation sources based on an estimated rate of phase change.

2. The method of claim 1 further comprising:
   increasing the first frequency by a coarse frequency step size; and
   decreasing the second frequency by the coarse frequency step size.

3. The method of claim 1 further comprising:
   decreasing the first frequency by a coarse frequency step size; and
   increasing the second frequency by the coarse frequency step size.

4. A method for downconverting a received signal, the method comprising:
   generating an analog carrier signal using a pulse density modulator and a low-pass filter, said analog carrier signal having a first frequency from a first generation source having a first frequency range and a first frequency resolution;
   multiplying the received signal by the analog carrier signal to produce an adjusted analog signal;
   sampling said adjusted analog signal to produce a digital sample stream;
   generating a digital carrier signal having a second frequency from a second generation source having a second frequency range and a second frequency resolution, wherein said first frequency range is greater than said second frequency range, and said first frequency resolution is less than said second frequency resolution;
   multiplying the adjusted analog signal by the digital carrier signal to generate a downconverted signal;
   determining phase error estimates in the downconverted signal;
   estimating a rate of phase change based on a plurality of phase error estimates; and
   controlling the first and second generation sources based on an estimated rate of phase change.

5. The method of claim 4 further comprising:
   increasing the first frequency by a coarse frequency step size; and
   decreasing the second frequency by the coarse frequency step size.

6. The method of claim 4 further comprising:
   decreasing the first frequency by a coarse frequency step size; and
   increasing the second frequency by the coarse frequency step size.

7. An apparatus for downconverting a received signal, the apparatus comprising:
   means for generating an analog carrier signal having a first frequency from a first generation source having a first frequency range and a first frequency resolution, said means for generating an analog carrier signal comprising a pulse density modulator and a low-pass filter;
   means for generating a digital carrier signal having a second frequency from a second generation source having a second frequency range and a second frequency resolution, wherein said first frequency range is greater than said second frequency range, and said first frequency resolution is less than said second frequency resolution;
   means for multiplying the received signal by the analog carrier signal and the digital carrier signal to generate a downconverted signal;
   means for determining phase error estimates in the downconverted signal;
   means for estimating a rate of phase change based on a plurality of phase error estimates; and
   means for controlling the first and second generation sources based on an estimated rate of phase change.

8. The method of claim 7 further comprising:
means for increasing the first frequency by a coarse frequency step size; and
means for decreasing the second frequency by the coarse frequency step size.

9. The method of claim 7 further comprising:
means for decreasing the first frequency by a coarse frequency step size; and
means for increasing the second frequency by the coarse frequency step size.

10. An apparatus for downconverting a received signal, the apparatus comprising:
means for generating an analog carrier signal having a first frequency from a first generation source having a first frequency range and a first frequency resolution, said means for generating an analog carrier signal including a pulse density modulator and a low-pass filter;
means for multiplying the received signal by the analog carrier signal to produce an adjusted analog signal;
means for sampling said adjusted analog signal to produce a digital sample stream;
means for generating a digital carrier signal having a second frequency from a second generation source having a second frequency range and a second frequency resolution, wherein said first frequency range is greater than said second frequency range, and said first frequency resolution is less than said second frequency resolution;
means for multiplying the adjusted analog signal by the digital carrier signal to generate a downconverted signal;
means for determining phase error estimates in the downconverted signal;
means for estimating a rate of phase change based on a plurality of phase error estimates; and
means for controlling the first and second generation sources based on an estimated rate of phase change.

11. The method of claim 10 further comprising:
means for increasing the first frequency by a coarse frequency step size; and
means for decreasing the second frequency by the coarse frequency step size.

12. The method of claim 10 further comprising:
means for decreasing the first frequency by a coarse frequency step size; and
means for increasing the second frequency by the coarse frequency step size.

13. A receiver apparatus comprising:
analog oscillator having a first frequency range and a first frequency resolution for producing an analog carrier signal having a first frequency, said analog oscillator producing the analog carrier signal using a pulse density modulator and a low-pass filter;
analog mixer for multiplying a received signal by the analog carrier signal to produce a first downconverted signal;
digital oscillator having a second frequency range and a second frequency resolution for producing a digital carrier signal having a second frequency, wherein said first frequency range is greater than said second frequency range, and said first frequency resolution is less than said second frequency resolution;
digital mixer for multiplying the first downconverted signal by the digital carrier signal to generate a second downconverted signal;
a frequency tracking module for estimating a rate of phase change based on a plurality of phase error measurements in the downconverted signal; and
a control processor for controlling the first and second generation sources based on an estimated rate of phase change.

14. The apparatus of claim 13 wherein said frequency tracking module is a frequency tracking loop.

15. The apparatus of claim 13 wherein said frequency tracking loop is a first-order frequency tracking loop.

16. The apparatus of claim 13 wherein said frequency tracking loop is a second-order frequency tracking loop.

17. The apparatus of claim 13 wherein said digital oscillator is a digital rotator.

18. The apparatus of claim 13 wherein said digital oscillator is a direct digital synthesizer.

19. The apparatus of claim 13 wherein said analog oscillator is a voltage-controlled oscillator.

20. The apparatus of claim 13 wherein said analog oscillator is a temperature-controlled crystal oscillator.

21. A computer-readable medium embodying a method for downconverting a received signal, the method comprising:
generating a first frequency control signal for controlling a first frequency of an analog carrier signal output by an analog oscillator having a first frequency range and a first frequency resolution, wherein the first frequency control signal is generated using a pulse density modulator and a low-pass filter;
generating concurrently with the first frequency control signal a second frequency control signal for controlling a second frequency of a digital carrier signal output by a digital oscillator having a second frequency range and a second frequency resolution, wherein the first frequency range is greater than the second frequency range, and the first frequency resolution is less than said second frequency resolution;
determining phase error estimates in the downconverted signal;
estimating a rate of phase change based on a plurality of phase error estimates; and
adjusting the second frequency based on said estimating.

22. The computer-readable medium of claim 21, wherein the method further comprises:
adjusting the first frequency control signal to increase the first frequency by a coarse frequency step size; and
adjusting the second frequency control signal to decrease the second frequency by the coarse frequency step size.

23. The computer-readable medium of claim 21, wherein the method further comprises:
adjusting the first frequency control signal to decrease the first frequency by a coarse frequency step size; and
adjusting the second frequency control signal to increase the second frequency by the coarse frequency step size.

24. The computer-readable medium of claim 21, wherein the first frequency control signal is a digital signal provided to a pulse density modulator.

25. The computer-readable medium of claim 21, wherein the second frequency control signal is a digital signal provided to a digital rotator.

26. The computer-readable medium of claim 21, wherein the second frequency control signal is a digital signal provided to a direct digital synthesizer.

* * * * *